(12) United States Patent
Bhat et al.

(10) Patent No.: US 10,209,337 B2
(45) Date of Patent: Feb. 19, 2019

(54) SIMULTANEOUS MULTI-SLICE MULTI-ECHO TURBO SPIN ECHO (TSE) IMAGING

(71) Applicant: Siemens Healthcare GmbH, Erlangen (DE)

(72) Inventors: Himanshu Bhat, Newton, MA (US); Pedro Miguel Itriago Leon, Caracas (VE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 293 days.

(21) Appl. No.: 15/139,732

(22) Filed: Apr. 27, 2016

(65) Prior Publication Data

US 2017/0315202 A1    Nov. 2, 2017

(51) Int. Cl.
*G01R 33/36* (2006.01)
*G01R 33/561* (2006.01)
*G01R 33/483* (2006.01)

(52) U.S. Cl.
CPC ..... *G01R 33/5617* (2013.01); *G01R 33/4835* (2013.01); *G01R 33/5611* (2013.01)

(58) Field of Classification Search
CPC ........ G01R 33/36; G01R 33/48; G01R 33/50; G01R 33/54; G01R 33/543; G01R 33/561; G01R 33/5602; G01R 33/5611; G01R 33/5612; G01R 33/5613; G01R 33/5616; G01R 33/5621; G01R 33/5617; G01R 33/482; G01R 33/4828; G01R 33/483; G01R 33/4835

See application file for complete search history.

(56) References Cited

U.S. PATENT DOCUMENTS

2015/0346300 A1* 12/2015 Setsompop ........ G01R 33/4828
324/309

OTHER PUBLICATIONS

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

* cited by examiner

*Primary Examiner* — Son Le
(74) *Attorney, Agent, or Firm* — Schiff Hardin LLP (57) ABSTRACT

In a method and apparatus for acquiring magnetic resonance (MR) raw data, an MR data acquisition scanner is operated to execute a turbo spin echo (TSE) or a turbo gradient spin echo (TGSE) sequence wherein nuclear spins are excited in multiple slices of the examination object simultaneously by radiating at least one radio-frequency (RF) pulse from an RF radiator of the MR data acquisition scanner, thereby causing the excited nuclear spins in said multiple slices to produce an echo train. A multi-band refocusing pulse is radiated that refocuses nuclear spins in at least one of said multiple slices that follows a first of the multiple slices, and readout gradients are activated to acquire MR signals, with respectively different contrasts, at respectively different readout times of the echo train. The read out MR signals are entered into an electronic memory organized as k-space.

14 Claims, 5 Drawing Sheets

SIMULTANEOUS MULTI-SLICE MULTI-ECHO TURBO SPIN ECHO (TSE) IMAGING

BACKGROUND OF THE INVENTION

Field of the Invention

The present invention concerns methods and systems for magnetic resonance (MR) imaging, and in particular concerns such methods and systems for implementing a turbo spin echo (TSE) data acquisition sequence.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The acquired MR signals are digitized and entered into an electronic memory, organized as k-space, as k-space data. The k-space data are also referred to as raw MR data. The k-space memory has a number of individual locations that are available for entering the digitized signal thereat (data entry points), and the path of data entry points along which the digitized data are entered is called the k-space trajectory. The acquired data can be entered into k-space linearly (line-by-line of data entry points) or radially, along a straight or curved path proceeding from the center of k-space toward the periphery of k-space.

Many reconstruction algorithms are known for operating on the k-space data to convert the k-space data into image data representing an image of the volume of the examination object from which the raw MR data were acquired. This reconstruction algorithm is executed in an image reconstruction computer, resulting in an image data file from the computer that can be shown at the display screen of a monitor, or archived for storage.

After the nuclear spins have been flipped by the RF excitation pulse, the resulting MR signal exhibits an exponential decay in strength as the excited nuclear spins relax. This decaying signal is referred to as an echo signal, or simply as an echo. A commonly used data acquisition sequence of appropriately timed RF excitations and gradient pulse activations (switchings) is the echo planar imaging (EPI) sequence. In an EPI sequence, instead of measuring only one echo after each excitation pulse, multiple echoes are detected by multiple activations of the readout gradient after a single excitation pulse. In an EPI sequence, therefore, the total echo time of the decaying MR signal that follows the excitation of the nuclear spins is divided into a number of individual echo times, corresponding to the number of activated readout gradients.

Another sequence which acquires multiple echoes after each excitation pulse is known as the turbo spin echo (TSE) sequence. Here, multiple refocusing RF pulses are radiated that continually refocus the decaying magnetization, and an individual echo signal is respectively acquired after each refocusing pulse. The repeatedly activated refocusing pulses slow the decay of the magnetization, so that the individually detected echoes have a higher signal strength than the echoes acquired in an EPI sequence.

In a sequence known as TurboGSE (TGSE), additional gradient echoes are generated before and after each spin echoes. The spin echoes are allocated to the center of k-space, in order to produce pure T2 contrast. If multiple image lines are obtained during a single echo, the imaging pulse sequence type is a TGSE pulse sequence.

The (effective) echo time (TE) is the time between the RF excitation pulse and the acquisition (sampling) of the MR signal of the k-space center. The repetition time (TR) is the time between two successive RF excitation pulses. By appropriately selecting TR and TE, the acquired MR signal can be differently weighted. In general terms, a sequence with a long TR and a short TE is usually called proton density (PD)-weighted, a sequence with a short TR and a short TE is usually called T1-weighted, and a sequence with a long TR and long TE sequence is usually called T2-weighted. (The physical reasons that result in the naming of these different types of weighting are not relevant to the discussion herein.)

The type of weighting that is selected, in general terms, determines which MR signal source (i.e., a source from which detected MR signals originate) will appear brighter in the reconstructed image, and which MR signal source will appear darker. Thus the selected weighting determines the contrast with which a particular MR signal source will be visually represented in the reconstructed image. In the case of medical MR imaging, the respective signal sources are different types of tissue, and therefore the type of weighting is selected dependent on the tissue that is desired to be shown with the best contrast in the reconstructed image, which is in turn dependent on the medical diagnosis that is desired to be made by evaluation of the reconstructed image.

In clinical practice, there is often the need to acquire the same image with the identical sequence type, but with different echo times. One application is the PD/T2 TSE sequence, wherein a PD-weighted image dataset and one or more T2-weighted image datasets are obtained, such as for head, abdomen or joint imaging. Another application is T2 mapping, making use of a TSE sequence.

Figure 1:
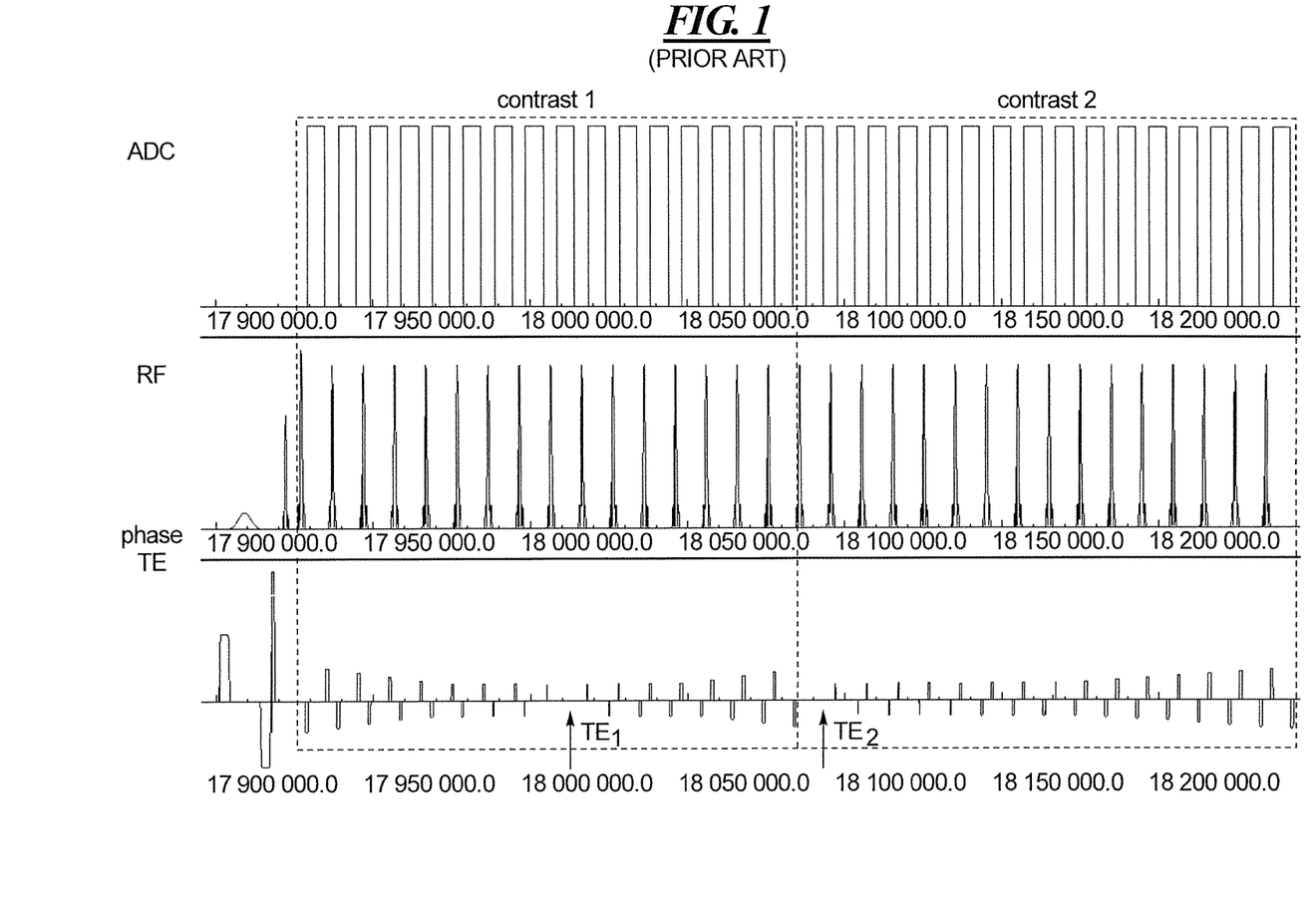
FIG. 1, as noted above, illustrates a conventional turbo spin echo (TSE) sequence for operating an MR scanner.

A conventional TSE sequence with different echo times combines two or more separate readout blocks back-to-back to each other, after a single excitation pulse, which produces one echo train. The sequence diagram for such a conventional TSE acquisition with two contrasts (TE1=89 ms and TE2=169 ms) with an echo train length of 16 for each contrast is shown in FIG. 1. After the MR data in the first block have been acquired (in this case with a linear k-space reordering scheme), the MR data for the second block are acquired, independently of the first block (in this case with a centric out k-space reordering scheme). This results in a relatively long total echo train length of 32.

As a consequence of these separated blocks, there is only limited freedom in selecting the echo times, because each echo time must fit into its respective block. In the example shown in FIG. 1, this means that TE1 can be selected in a range between 9 to 159 ms, while TE2 can be selected between 169 and 329 ms. If a shorter time between the two echoes is desired (for example, TE1=59 ms, TE2=99 ms), a shorter echo train must be selected, thereby further prolonging the total acquisition time.

Figure 2A:
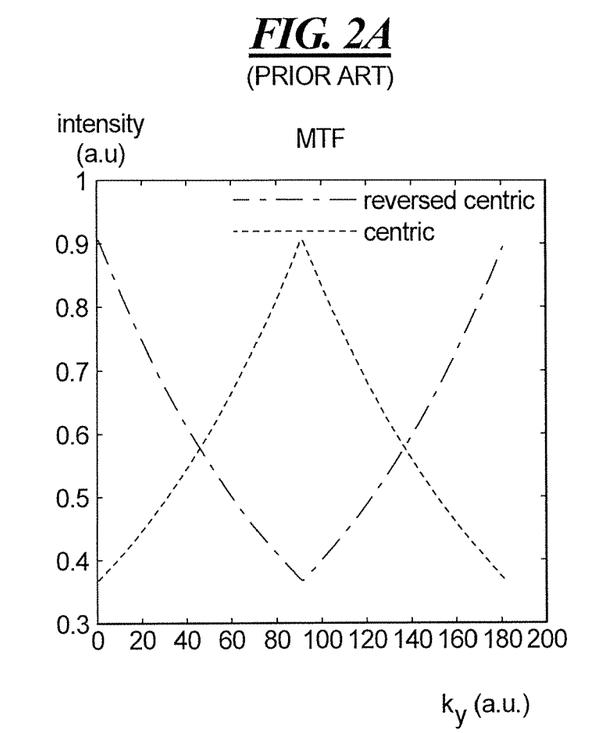
FIGS. 2A and 2B, as noted above, respectively illustrate different modulation transfer functions (MTF) and point spread functions (PSF) that result from different reordering of the k-space lines, used with the conventional TSE sequence shown in FIG. 1.
Figure 2B:
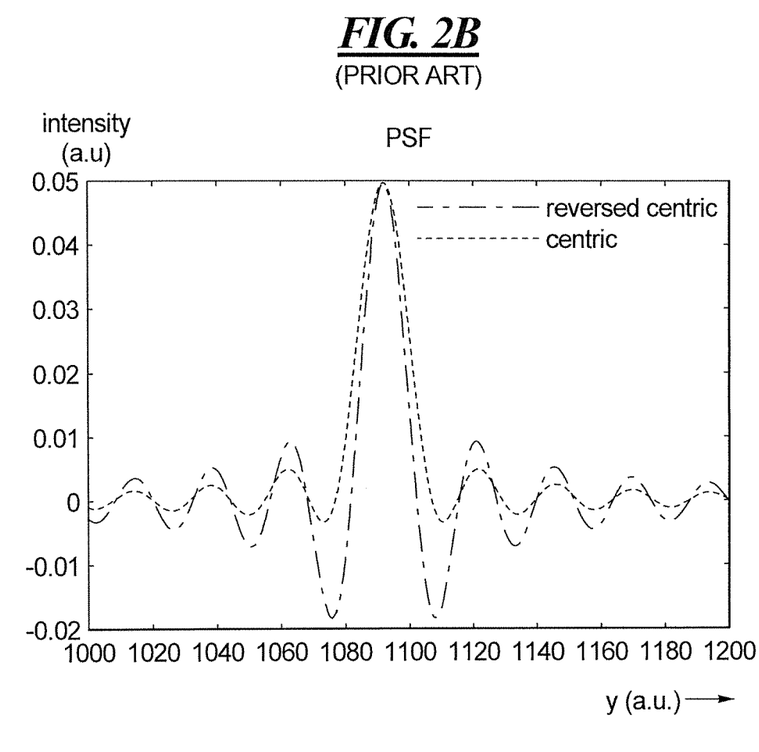

Another disadvantage that results from this use of a conventional TSE sequence results from different modulation transfer functions (MTF) and point spread functions (PSF) that describe the filtering that acts on the image data, depending on the aforementioned reordering of the k-space lines. The PSF is the equivalent of the MTF in the image domain. If the TEs for the different contrasts are not placed exactly at the same positions within the blocks, the MFT, and thus the PSF, will differ for the different contrasts. In the example of FIG. 1, if TE1 is at the beginning of the first acquisition block, the reordering must be centric out, which will lead to stronger filtering and thus a reduced spatial resolution. If TE2 is at the end of the second acquisition block, the reordering must be reversed centric, which will lead to stronger side lobes in the PSF, and thus a more pronounced phenomenon known as Gibbs ringing. Apart from different image impressions (visualizations) this leads to inaccurate results in T2 fitting, because the respective intensities of the individual pixels of the respective contrast images are altered differently by the different MTFs. An example of MTFs for centric reordering and reversed centric reordering is shown in FIG. 2A, and the corresponding PSFs for centric and reversed centric reordering are shown in FIG. 2B.

A technique for accelerating MR data acquisition, and thereby reducing the time that the patient must spend within the MR scanner, is the simultaneous multi-slice (SMS) technique. Details of techniques for SMS data acquisition can be found in the article by Setsompop et al., "Blipped-Controlled Aliasing in Parallel Imaging for Simultaneous Multi-Slice Echo Planar Imaging with Reduced g-factor Penalty," Magnetic Resonance in Medicine, Vol. 67(5), pp. 1210-1224 (2012). In general, the SMS technique involves the simultaneous excitation of a number of slices of a volume that is to be imaged, and the simultaneous acquisition of the resulting MR signals from the multiple slices. The number of slices that are simultaneously excited are typically grouped in a slice group. The SMS technique is typically characterized by an acceleration factor that indicates how many slices are simultaneously excited in a slice group by one individual radio-frequency pulse. The acceleration factor is at least two.

Figure 3:
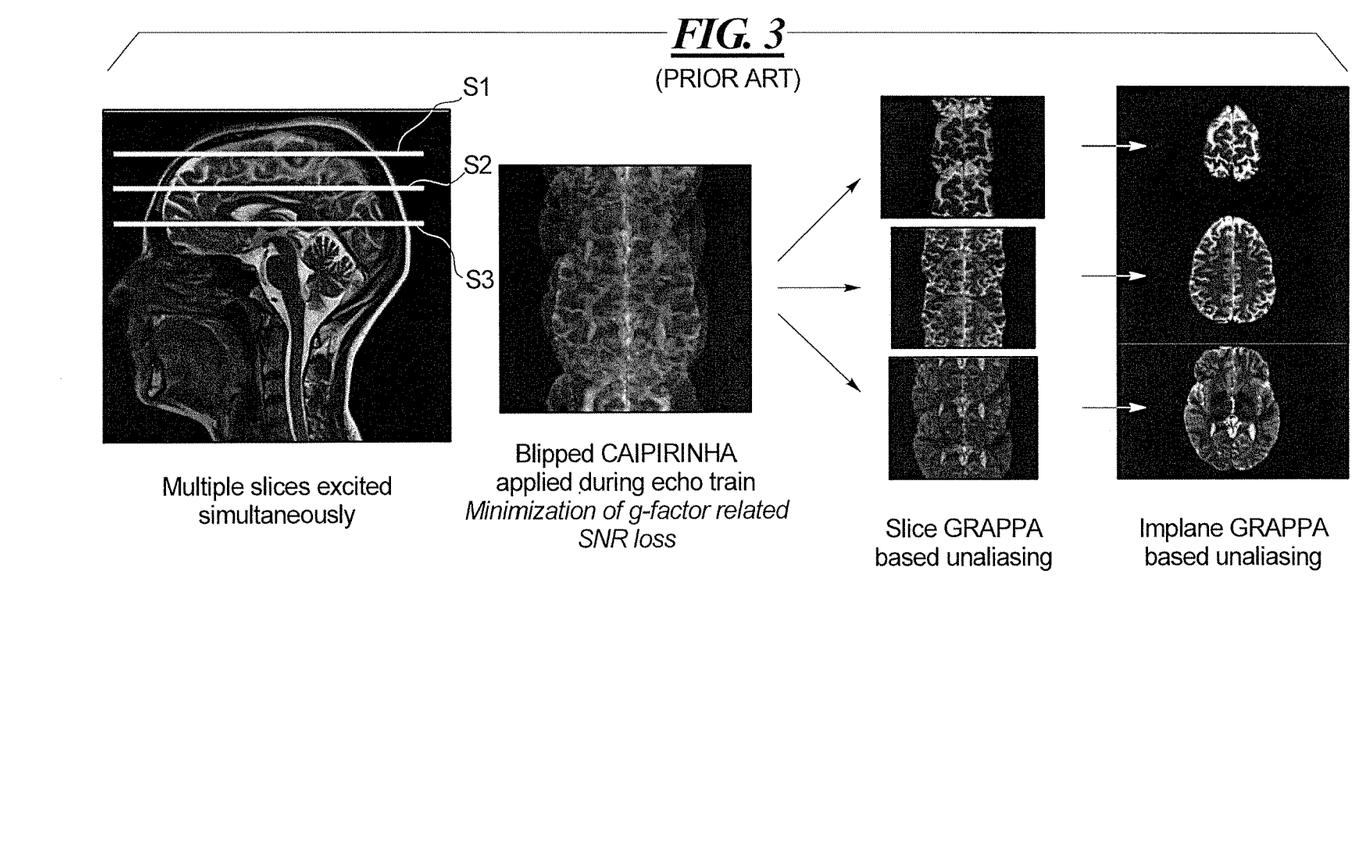
FIG. 3, as noted above, schematically illustrates a conventional simultaneous multi-slice (SMS) data acquisition and separation of the acquired data in order to reconstruct individual images of the multiple slices.

Since the k-space data for all of the simultaneously acquired slices are entered simultaneously into k-space, the subsequent reconstruction of the respective images of the individual slices involves a separation of the k-space data for the multiple slices. The data for the respective slices can be separated using a known slice separation method, such as the slice GRAPPA (Generalized Autocalibration Partially Parallel Acquisitions) technique, noted in the aforementioned article by Setsompop et al. This enables the SMS technique to be used to acquire a number of slices at the same time. A schematic illustration of this known technique is shown in FIG. 3, for the example of three slices S1, S2 and S3.

As noted above, in SMS imaging, multiple slices are excited at the same time. In the example of FIG. 3, this takes place using blipped CAIPIRINHA (Controlled Aliasing in Parallel Imaging Results in Higher Acceleration), and is described in the aforementioned article by Setsompop et al. (shortened to blipped CAIPI therein)

In SMS imaging, in order to excite multiple slices simultaneously, a multi-band (MB) excitation pulse is used. For each slice in which the nuclear spins are to be excited, a linear phase ramp is added to a standard excitation pulse. The linear phase results in a slice shift in the spatial domain. The pulse shapes for all bands are added (superimposed), resulting in a baseband-modulated MB pulse.

The individual signals that are superimposed as a result of the MB pulse are received from respective individual coils of the MR data acquisition scanner. These coils necessarily respectively occupy different spatial positions, but are in close enough proximity to each other so that the same nuclear spins will be detected by more than one of the multiple coils. Because each coil is situated at a different position in space, however, the effect of each individual coil on the reception of a given individual nuclear spin will be slightly different, and must be taken into account. This is done by calculating a so-called g-factor (geometry factor) for the coil array that is used. The extent to which the g-factor degrades the resulting reconstructed image is called the g-factor penalty. In order to reduce the g-factor penalty in SMS imaging, interslice image shifts are deliberately induced during the readout in blipped CAIPI, either by gradient blips on the slice axis or by modulating the phase of the RF pulses. After the data have been acquired, the simultaneously excited slices are collapsed into a single slice for entry of the data into k-space. The individual slices can be separated in the post-processing, utilizing the aforementioned slice GRAPPA technique, as schematically illustrated in FIG. 3.

SUMMARY OF THE INVENTION

An object of the present invention is to provide a magnetic resonance imaging method and apparatus wherein raw datasets are acquired in a TSE or TGSE sequence, from which images having respectively different contrasts can be reconstructed, wherein the aforementioned disadvantages are avoided to at least alleviated.

This object is achieved in accordance with the present invention by a magnetic resonance data acquisition method and system wherein the raw data are acquired by executing a TSE sequence but wherein, instead of acquiring the respective raw datasets with different contrasts back-to-back to each other in a single echo train, the datasets representing different contrasts are acquired with an SMS data acquisition technique.

The basis of inventive method and apparatus is to excite the slices from which data are to be acquired simultaneously at different points in time while the readout echo train is shared, and the individual k-space locations are acquired (sampled or filled) simultaneously.

Compared to conventionally used techniques for multi-echo acquisition, the method and apparatus in accordance with the present invention are beneficial when echo times for different contrasts should not be too far apart in time. The inventive method also results in a shorter total echo train length. Additionally, identical MTFs are achieved, because both contrasts share the same reordering scheme, and the different echo trains are produced by shifted acquisition.

In summary, in accordance with the invention, additional excitation pulses at different points in time, compared to a conventional TSE or TGSE sequence, are radiated, and single-band and multi-band pulses are combined within one echo train. This results in more flexible echo times, a shorter total echo train length, identical MFT properties, and thus identical blurring and Gibbs artifacts.

DESCRIPTION OF THE PREFERRED EMBODIMENTS

Figure 4:
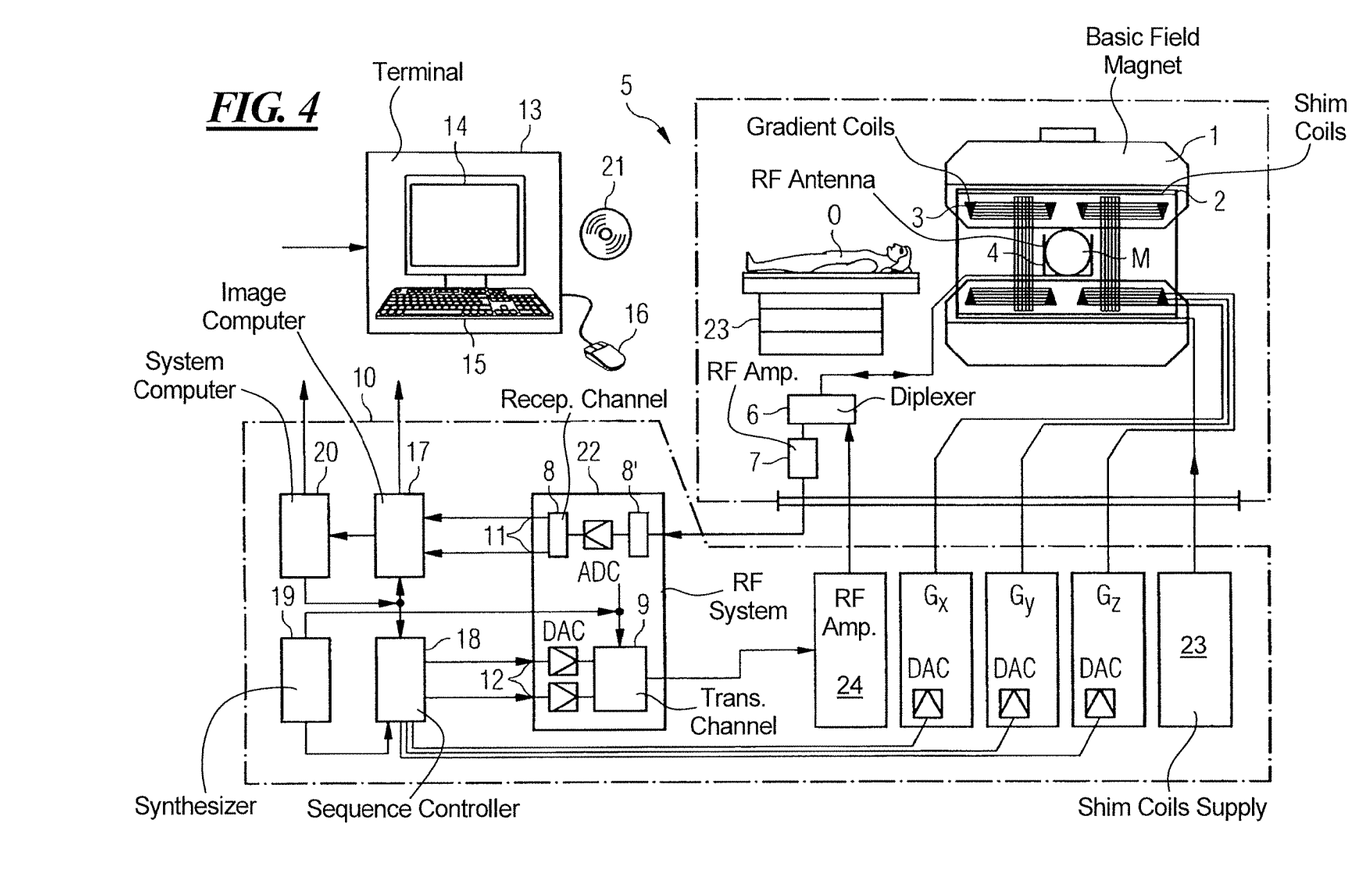
FIG. 4 is a block diagram of the basic components of a magnetic resonance apparatus constructed and operating in accordance with the present invention.

FIG. 4 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 27 for the shim-coils 2.

A cylindrically shaped gradient coil system 3 is incorporated in the basic field magnet 1, composed of three windings. Each winding is supplied by a corresponding amplifier 24-26 with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

Figure 5:
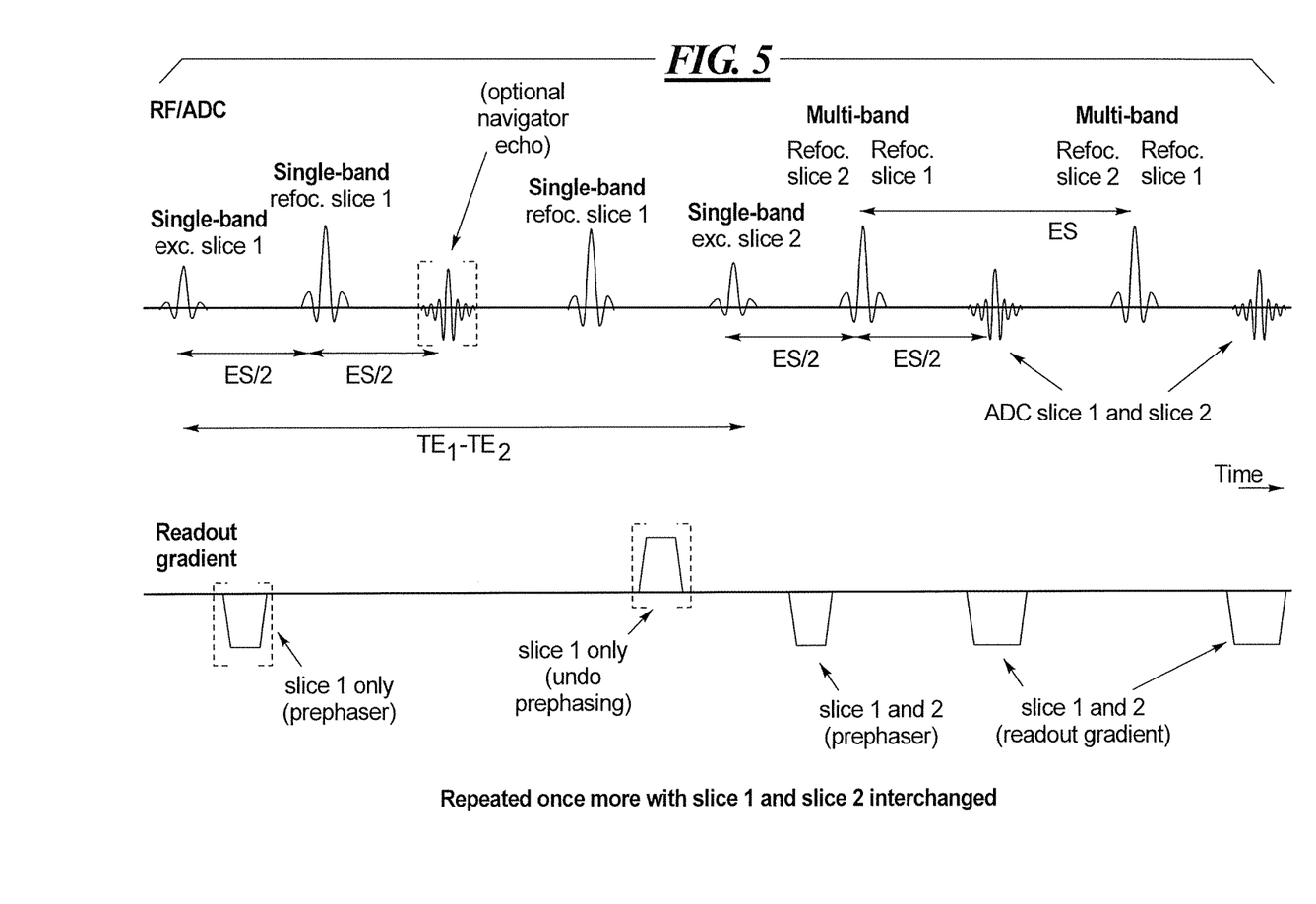
FIG. 5 schematically illustrates an embodiment of an SMS acquisition sequence in accordance with the present invention.

FIG. 5 is a sequence diagram of the SMS data acquisition procedure in accordance with the invention, with the radiated RF pulses, the detected ADC signals and the readout gradient being schematically illustrated. FIG. 5 shows the example of a two-fold slice-accelerated acquisition (Slice 1 and Slice 2 are the slices to be acquired simultaneously). The first excitation pulse targets only Slice 1. Conditions known as CPMG (Carr, Purcell, Melboom, Gill) conditions are well known in the field of magnetic resonance imaging. When these conditions are satisfied in the context of a TSE sequence, the primary and stimulated echoes occur only at the midpoint between two consecutive refocusing pulses, and have the same phase. In order to fulfill the CPMG conditions in the sequence shown in FIG. 5, the spins for Slice 1 are refocused at every echo spacing ES period. After the desired shift time between the two TEs to be acquired has passed, Slice 2 is excited between two refocusing pulses. The first two refocusing pulses refocus Slice 1 only while the third refocusing pulse is a multi-band (MB) pulse that refocuses Slices 1 and 2 simultaneously. After that point in time, a standard TSE echo train follows, with all refocusing pulses being MB pulses, and thus all echoes being acquired from Slices 1 and 2 simultaneously.

Depending on the desired difference among TEs, navigator echoes can be acquired for Slice 1 in the period before the excitation of Slice 2. These may be non-phase encoded echoes (such as for phase correction between different echo train segments), or phase-encoded echoes with arbitrary phrase encoding steps (such as for a GRAPPA calibration scan or a motion-correction scan).

A readout dephaser, which targets the spins of Slice 1, is activated before the excitation pulse for Slice 2, so as to avoid the readout prephaser, after the excitation of Slice 2, dephasing the spins of Slice 1, and instead prephases the spins in both Slice 1 and Slice 2.

At a later point in time, the echo train is repeated with Slices 1 and 2 being swapped (exchanged).

If a slice acceleration factor greater than 2 is used, at least one type of the SB pulses can be radiated as MB pulses. For example, in addition to Slice 1, a third slice (Slice 3) is also excited simultaneously, leading to $TE_1$ for Slices 1 and 3, and $TE_2$. In a second repetition, Slice 2 is excited first and Slices 1 and 3 are subsequently excited. In a different scenario different echo times can be achieved for each slice.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) raw data, comprising:
   operating an MR data acquisition scanner to execute an accelerated spin echo sequence while an examination object is situated in the MR data acquisition scanner;
   in said accelerated spin echo sequence, exciting nuclear spins in multiple slices of the examination object at respectively different points in time by radiating multiple radio-frequency (RF) pulses from an RF radiator of said MR data acquisition scanner, said multiple slices comprising at least one first slice and at least one additional slice and thereby causing the excited nuclear spins in said multiple slices to produce an echo train;
   in said accelerated spin echo sequence, radiating a multi-band refocusing pulse from said RF radiator that refocuses the nuclear spins in all of the multiple slices in which the nuclear spins were respectively excited at said different points in time, and activating read out gradients to acquire MR signals, with respectively different contrasts that result from the nuclear spins in the multiple slices having been respectively excited at said different points in time, at respectively different readout times of said echo train;
   providing the read out MR signals to a computer and, from said computer, entering the readout MR signals as k-space data into an electronic memory organized as k-space; and
   in said computer, reconstructing image from the k-space data and displaying said image data as an image of said multiple slices, comprising said different contrasts, at a display screen.

2. A method as claimed in claim 1 comprising, in said computer, separating the k-space data respectively for said multiple slices by executing a partial parallel acquisition separation algorithm and reconstructing said image data as respective individual images of said slices.

3. A method as claimed in claim 2 comprising executing a slice GRAPPA (Generalized Autocalibration Partially Parallel Acquisitions) separation algorithm as said partial parallel acquisition algorithm.

4. A method as claimed in claim 1 comprising exciting said nuclear spins in said multiple slices by initially exciting nuclear spins at least in said first slice or slices with either a single band RF pulse or multi-band RF pulse respectively and thereafter refocusing said nuclear spins in said first slice or slices for a selected number of repetitions with a single band refocusing pulse or a multi-band refocusing pulse respectively, and thereafter exciting nuclear spins in said at least one additional slice or slices with a single band RF pulse or a multi-band RF pulse respectively, and thereafter refocusing the nuclear spins in said first slice or slices and said at least one additional slice or slices for a selected number of repetitions by radiating a multi-band refocusing pulse that targets said first slice or slices and said at least one additional slice or slices and the possibility of acquiring different contrasts between the refocused signals from said first slice or slices and the refocused signals from said at least one additional slice or slices.

5. A method as claimed in claim 4 comprising acquiring a navigator echo from said first slice or slices after refocusing said first slice or slices.

6. A method as claimed in claim 4 comprising acquiring a navigator echo from said second slice or slices after refocusing said second slice or slices.

7. A method as claimed in claim 1 comprising operating said MR data acquisition scanner to execute said accelerated spin echo sequence as a sequence selected from the group consisting of a turbo spin echo (TSE) sequence and a turbo gradient spin echo (TGSE) sequence.

8. A magnetic resonance (MR) apparatus comprising:
   an MR data acquisition scanner comprising a radio-frequency (RF) radiator and a gradient coil arrangement;
   a control computer configured to operate said MR data acquisition scanner to execute an accelerated spin echo sequence while an examination object is situated in the MR data acquisition scanner;
   said control computer being configured to operate said MR data acquisition scanner in said accelerated spin echo sequence to excite nuclear spins in multiple slices of the examination object at respectively different points in time by radiating multiple RF pulses from said RF radiator of said MR data acquisition scanner, said multiple slices comprising a first slice or slices and at least one additional slice or slices and thereby causing the excited nuclear spins in said multiple slices to produce an echo train;
   said control computer being configured to operate said MR data acquisition scanner in said accelerated spin echo sequence by operating said RF radiator to radiate a multi-band refocusing pulse from said RF radiator that refocuses the nuclear spins in all of the multiple slices in which the nuclear spins were respectively excited at said different points in time, and to operate said gradient coil arrangement to activate readout gradients to acquire MR signals, with respectively different contrasts that result from the nuclear spins in the multiple slices having been respectively excited at said different points in time, at respectively different readout times of said echo train;

an electronic memory organized as k-space;

a display having a display screen;

said control computer being configured to the read out MR signals as k-space data into said electronic memory; and said computer being configured to reconstruct image data from the k-space data and to display said image data as an image of said multiple slices, comprising said different contrasts, at said display screen.

9. An apparatus as claimed in claim 8 wherein said computer is configured to separate the k-space data respectively for said multiple slices by executing a partial parallel acquisition separation algorithm and to reconstruct said image data as respective individual images of said slices.

10. An apparatus as claimed in claim 9 wherein said image reconstruction computer is configured to execute a slice GRAPPA (Generalized Autocalibration Partially Parallel Acquisitions) separation algorithm as said partial parallel acquisition algorithm.

11. An apparatus as claimed in claim 9 wherein said control computer is configured to operate said MR data acquisition scanner to excite said multiple slices by initially exciting nuclear spins at least in said first slice or slices with a single band RF pulse or a multi-band RF pulse respectively and thereafter refocusing said nuclear spins in said first slice or slices for a selected number of repetitions with a single band refocusing pulse or a multi-band refocusing pulse respectively, and thereafter exciting nuclear spins in said at least one additional slice or slices with a single band RF pulse or a multi-band RF pulse respectively, and thereafter refocusing the nuclear spins in said first slice or slices and said at least one additional slice or slices for a selected number of repetitions by radiating a multi-band refocusing pulse that targets said first slice or slices and said at least one additional slice or slices.

12. An apparatus as claimed in claim 11 wherein said control computer is configured to operate said MR data acquisition scanner to acquire a navigator echo from said first slice or slices after refocusing said first slice or slices.

13. An apparatus as claimed in claim 12 wherein said control computer is configured to operate said MR data acquisition scanner to acquire a navigator echo from said second slice or slices after refocusing said second slice or slices.

14. An apparatus as claimed in claim 8 wherein said control computer is configured to operate said MR data acquisition scanner to execute said accelerated spin echo sequence as a sequence selected from the group consisting of a turbo spin echo (TSE) sequence and a turbo gradient spin echo (TGSE) sequence.

* * * * *